United States Patent [19]

Swanson et al.

[11] Patent Number: 5,006,764

[45] Date of Patent: Apr. 9, 1991

[54] FLUORESCENT LAMP BALLAST WITH END CONNECTOR

[75] Inventors: Dail L. Swanson; Larry J. Costa, both of Danville, Ill.

[73] Assignee: Valmont Industries, Inc., Valley, Nebr.

[21] Appl. No.: 381,035

[22] Filed: Jul. 17, 1989

[51] Int. Cl.$^5$ .................... H05K 5/04

[52] U.S. Cl. .................... 315/276; 336/65; 336/90; 174/59; 174/DIG. 2; 439/76; 361/377

[58] Field of Search .................... 315/276, DIG. 5; 336/65, 90, 96, 107; 174/DIG. 2; 361/377

[56] References Cited

U.S. PATENT DOCUMENTS

| | | | |
|---|---|---|---|
| 3,655,906 | 4/1972 | Robb | 174/DIG. 2 |
| 4,460,883 | 7/1984 | Van Der Hoek | 336/65 |
| 4,729,740 | 3/1988 | Crowe et al. | 174/DIG. 2 |
| 4,897,627 | 1/1990 | Van Wagener et al. | 336/65 |
| 4,916,363 | 4/1990 | Burton et al. | 336/90 |

*Primary Examiner*—Eugene R. Laroche
*Assistant Examiner*—Son Dinh
*Attorney, Agent, or Firm*—Zarley, McKee, Thomte, Voorhees & Sease

[57] ABSTRACT

A fluorescent lamp ballast includes a generally flat base upon which a core and coil subassembly is mounted and covered by a ballast case. A connector bar is mounted in the forward end of the ballast case and includes a plurality of sockets having terminal pins mounted therein for selectively receiving a wiring harness. The opposing ends of the terminal pins are electrically connected to a terminal strip which is mounted to the core and coil subassembly. The terminal strips have conductors electrically connected thereto which extend to termination points on the core and coil subassembly. A second series of terminal strips is mounted to the opposite end of the core and coil subassembly, and is electrically connected to a resistor and capacitor combination. A second embodiment of the ballast augments the first embodiment with an end connector bar mounted in the rearward end of the ballast case. A second version of a terminal strip, in the second connector bar, is designed to electrically connect terminal pins to either a conductor from the appropriate coil or to "passed through" connections from terminals at the forward end. A third version of the ballast utilizes the second embodiment of the terminal strip at the forward end of the ballast case to permit rearrangement of the resistor and capacitor combination to the forward end.

7 Claims, 2 Drawing Sheets

FLUORESCENT LAMP BALLAST WITH END CONNECTOR

TECHNICAL FIELD

The present invention relates generally to ballasts for fluorescent lamp fixtures, and more particularly to an improved ballast having electrical connections formed in the end thereof.

BACKGROUND OF THE INVENTION

Conventional fluorescent fixtures utilize ballasts which are positioned within a ballast case comprised of a flat base portion and a cover portion secured thereto. The conventional ballasts normally include a core and coil subassembly mounted on one end of the base portion with the terminations of the coils extending therefrom. The core and coil assembly is preferably positioned in the case so that the assembly is spaced from the top surface of the case and the sides thereof, for heat and sound insulation purposes. During the manufacture of the ballast, elongated flexible external leads are electrically connected to predetermined coil terminations. The total subassembly may then be encased in an asphalt silica sand potting compound. The ballast cover is then secured over the ballast components with the flexible leads extending outwardly from the case. These discrete external leads are subsequently electrically connected to leads or terminals in lamp holders or the like.

While the above described fixtures are generally satisfactory in operation, they do suffer several drawbacks or disadvantages. One disadvantage of prior art fixtures is that different lamp manufacturers require ballasts having leads of different lengths, thereby requiring the ballast manufacturer to produce, and inventory, ballasts having various lead lengths. Further, each individual manufacturer may require various length leads to accommodate various lamp fixtures.

One form of a ballast which overcomes several of the problems associated with ballasts having discrete leads, is the "leadless ballast" disclosed in U.S. patent application Ser. No. 257,528, filed Oct. 14, 1988 entitled "An Improved Ballast", the disclosure of which is incorporated herein by reference. The ballast of the co-pending application may be described as a "leadless ballast" in view of the fact that no discrete external leads extend from the ballast. Rather, the core and coil subassembly is mounted in one end of the case, and has terminal pins extending from one end of the core and coil subassembly which are connected to an electrical connector means. The ballast case is provided with an access opening formed in the top thereof to facilitate the extension or insertion of one end of a wiring harness therethrough, which is then fitted to form a "pressure lock" connection with the electrical connector means and to complete the desired wiring circuit.

While the invention disclosed and described in the co-pending application is an improvement over ballasts having discrete leads, there are several instances where it still has drawbacks or disadvantages. One drawback is in the use of the above-described ballast in a totally unitized lamp holder, lamp socket, ballast connector harness assembly which is mounted integral with the light fixture, as described in the co-pending patent application entitled "Fluorescent Fixture Housing with Integral Lamp Sockets and Electrical Connections", filed simultaneously herewith, the disclosure of which is incorporated herein by reference. An electrical connection on the top portion of the ballast would not allow the ballast to be quickly and easily connected to a wiring harness mounted on the base of the fixture housing.

One additional drawback of the ballast of the co-pending application, Ser. No. 257,538, is in the use of a pressure lock connection between the wiring harness and the connector means. A release comb is necessary to maintain the electrical connections between the wiring harness and the connector pins. The use of a release comb is one additional component which must be manufactured and installed, adding time and labor costs.

Another drawback to prior art ballasts is in the large number of interconnections from the coils of the ballast to the eventual lamp holder contacts. A large number of interconnections reduces the reliability of the ballast and the total system. A large number of interconnections also increases the cost of the ballast because of the more complex configuration.

It is therefore a general object of the present invention to provide an improved leadless ballast.

Yet another object of the present invention is to provide a leadless ballast which lends itself to mechanized manufacture, thereby reducing the cost of the ballast.

Still another object of the present invention is to provide a ballast which is mechanizable for fixture assembly to reduce fixture assembly labor costs.

Still another object of the invention is to provide a leadless ballast which permits an inventory reduction of ballasts.

A further object of the invention is to provide a ballast having an end connector to facilitate electrical connection thereof to a wiring harness extending from a lamp fixture.

Still a further object of the invention is to provide a ballast which is adapted for use in a fluorescent lamp fixture having integral lamp holders and electrical connections.

These and other objects of the present invention will be apparent to those skilled in the art.

SUMMARY OF THE INVENTION

The fluorescent lamp ballast of the present invention includes a generally flat base upon which a core and coil subassembly is mounted and covered by a ballast case. A connector bar is mounted in the forward end of the ballast case and includes a plurality of sockets having terminal pins mounted therein for selectively receiving a wiring harness. The opposing ends of the terminal pins are electrically connected to a terminal strip which is mounted to the core and coil subassembly. Each terminal strip has a pair of opposing tabs with vertically aligned apertures which will receive a vertical end of the terminal pins therethrough, to electrically connect the terminal pins to the terminal strip. The opposite end of the terminal strips have conductors electrically connected thereto and extending to their appropriate termination on the core and coil subassembly. A second series of terminal strips is mounted to the opposite end of the core and coil subassembly, and will receive the terminal pin from a resistor and capacitor combination.

A second embodiment of the ballast augments the first embodiment with an end connector bar mounted in the rearward end of the ballast case. A set of terminal pins extends from the sockets of the second end connector bar to a second embodiment of the terminal strip. The second version of the terminal strip includes opposing tabs having a pair of apertures therein for receiving and electrically connecting terminal pins to either a conductor from the appropriate coil or to "passed through" connections from terminals at the opposing end—as may be required for "modular" installations.

A third version of the ballast utilizes the second embodiment of the terminal strip at the forward end of the ballast case to permit rearrangement of the resistor and capacitor combination to the forward end, adjacent the forward end connector. Terminal pins projecting from the end connector are electrically connected to one of the apertures in the tabs of the terminal strip, and the terminal pin from the resistor and capacitor combination may be selectively attached to one or more of the second apertures of the second embodiment of the terminal strip.

DESCRIPTION OF THE PREFERRED EMBODIMENT

Figure 1:
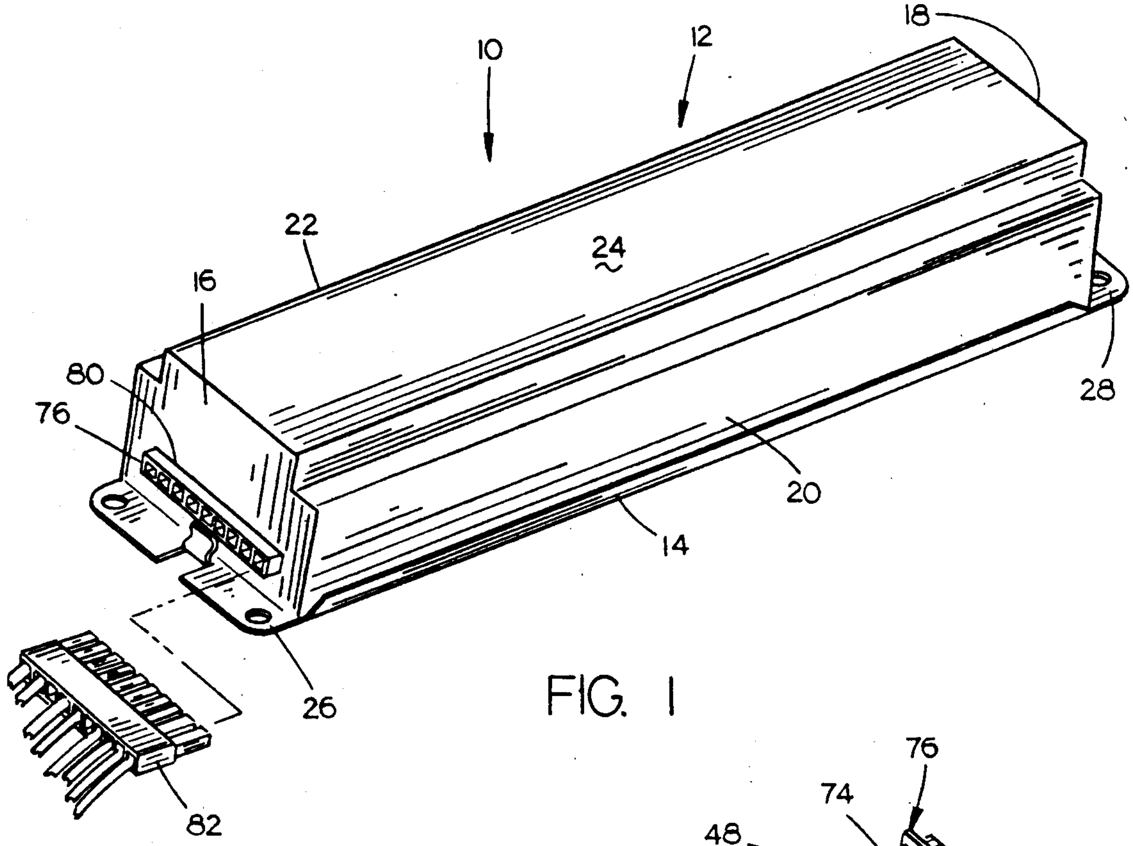
FIG. 1 is a perspective view of the ballast of the present invention.

Referring now to the drawings, in which identical or corresponding parts are identified with the same reference numeral, and more particularly to FIG. 1, the leadless ballast of the present invention is designated generally at 10 and includes a cover 12 mounted on an elongated flat base 14. Cover 12 includes a depending forward end 16, an opposite rearward end 18, as well as depending sides 20 and 22 depending from a top surface 24. Cover 12 is designed to extend over the components of the ballast and to be secured to base 14. Flanges 26 and 28 extend laterally from the the lower ends of end walls 16 and 18 respectively, and may be affixed to base 14 in a conventional manner.

Figure 2:
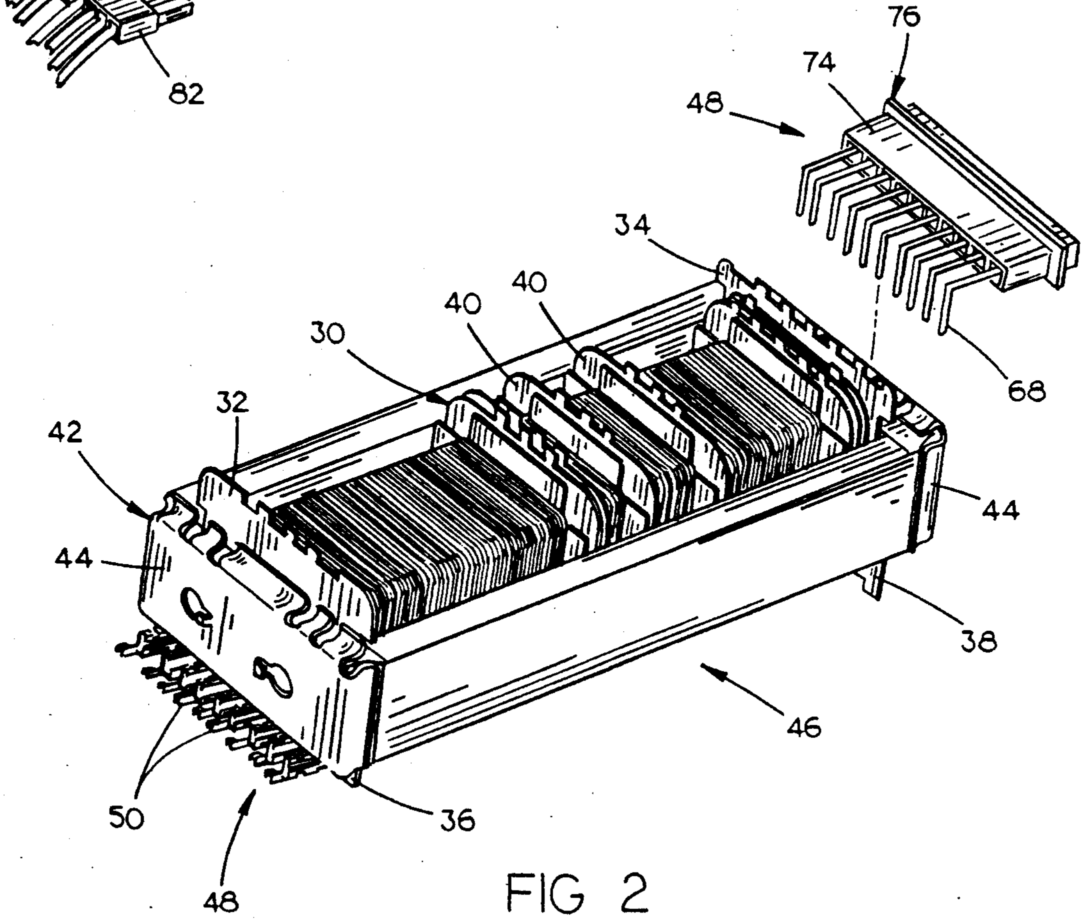
FIG. 2 is a perspective view of the core and coil subassembly of a ballast of the present invention, with an end connector exploded apart therefrom.

The numeral 30 refers to the bobbin portion of the ballast as shown in FIG. 2. Bobbin 30 is comprised of a thermoplastic material and is provided with a substantially elongated square body portion having upstanding ends 32 and 34 at the opposite ends thereof. End 32 is provided with a pair of downwardly extending foot portions 36, and end 34 is provided with a pair of depending foot portions 38, as shown in the drawings. A series of spaced-apart flanges or walls 40 extend radially from the bobbin body 30 in spaced-apart relationship to define coil winding sections for cathode, primary and/or secondary coils.

The bobbin portion of this invention is adapted to be used with various types of core structures, although the core structure illustrated in FIG. 2 is the preferred type of core structure, and is referred generally by the reference numeral 42. For purposes of description, core 42 is of the laminated and clamped type, clamps 44 being located at each end, but could be comprised of the laminated and welded type if so desired.

For convenience of description, the numeral 46 will designate the core and coil as subassembly. Core and coil subassembly 46 would normally be impregnated with an asphalt wax material and then positioned in case 12 at one end. Then subassembly 46 would be encapsulated with an asphalt, silica sand potting compound.

The numeral 48 refers generally to the end connector means of the invention, which is positioned at one, or both ends of the core and coil subassembly 46, as illustrated in the drawings. End connector means 48 includes a plurality of elongated terminal strip members 50 connected at their rearward ends 52 to the foot portions 36 or 38 of bobbin 30.

Figure 3:
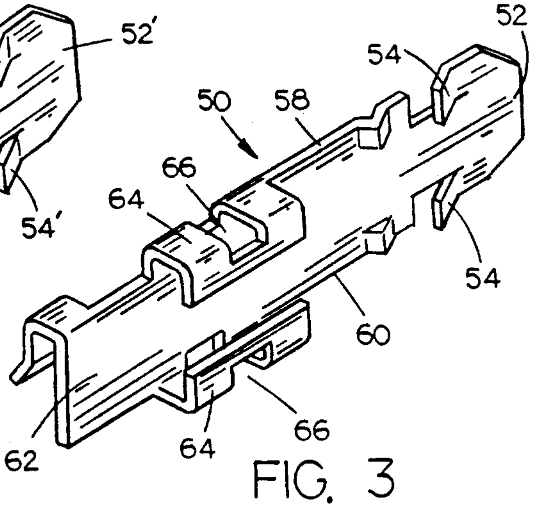
FIG. 3 is a perspective view of a first embodiment of a terminal strip utilized in the end connector of the present invention.

Referring now to FIG. 3, terminal strips 50 are arranged vertically, and have a pair of teeth 54 punched in the rearward end thereof which are received in pockets on foot portions 36 and 38 to lock the terminal strips in place. The forward end 62 of terminals 50 will have a conductor electrically connected thereto, such as by soldering, from one of the coils of the core and coil subassembly 46. The specific arrangement of connections between the core and coil subassembly 46 and terminal strips 50 may be predetermined as desired to provide the desired electrical circuitry.

For purposes of description, each terminal strip 50 will be described as having an upper edge 58 and lower edge 60 in addition to a forward end 62 and its rearward end 52. As can be seen in the drawings, teeth 54 are formed on opposing upper and lower edges of terminal 50, so as to be vertically aligned. A pair of pin-receiving tabs 64 are formed intermediate the forward and rearward ends of the terminal, along opposite upper and lower edges, as shown in FIG. 3. Tabs 64 are formed with an aperture 66 therein, axial to one another so as to receive a generally cylindrical terminal pin 68 (see FIGS. 2, 5 and 6) vertically therethrough, and thereby maintain the pin vertically and in electrical contact therewith. Tabs 64 have a generally C-shaped cross-section, and may be crimped so as to firmly electrically connect pin 68 to the terminal strip 50.

Figure 5:
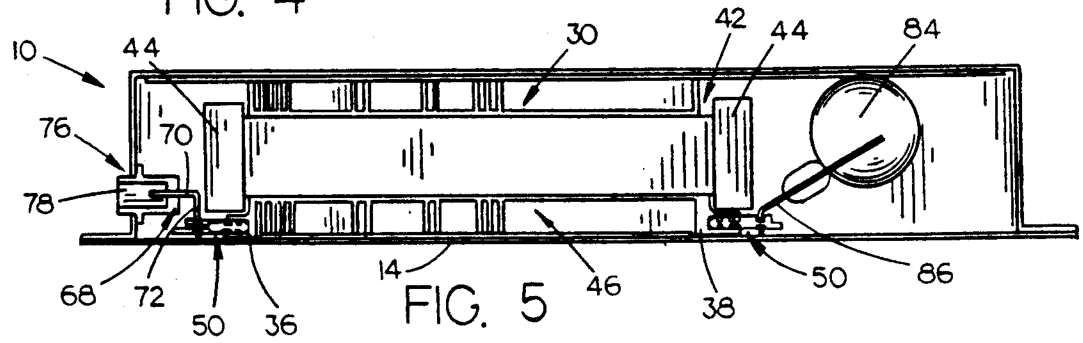
FIG. 5 is a longitudinal sectional view of a first embodiment of the ballast of the present invention.

Each terminal pin 68 is bent near its middle to form a horizontal end 70 and vertical end 72. The horizontal end 70 of each terminal pin 68 is inserted through the rearward end 74 of a connector bar 76 so as to project forwardly therein. Horizontal end 70 of each terminal pin 68 projects within a connector pocket 78 as shown in FIG. 5. Connector bar 76 is mounted in an opening 80 in the forward end 16 of ballast cover 12. In this fashion, all of the horizontal ends 70 of terminal pins 68 are readily accessible to a wiring harness 82 (see FIG. 1) which may be fixed within a fluorescent lamp fixture (not shown). A simple connector-to-socket interface will electrically connect all of the terminal pins 68 to the wiring harness 82, and thereby electrically connect all of the appropriate conductors from the core and coil subassembly 46.

Figure 6:
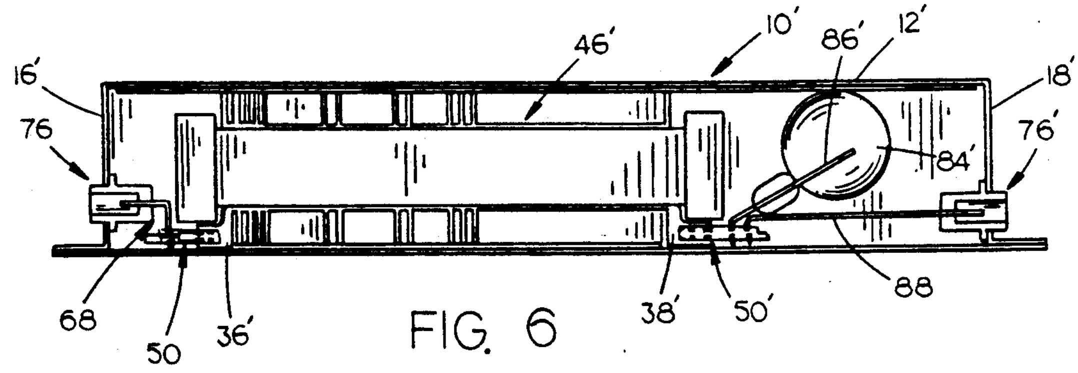
FIG. 6 is a longitudinal sectional view of a second embodiment of the ballast of the present invention.

As shown in FIGS. 2, 5 and 6, additional terminal strips 50 may be attached to foot portion 38 of rearward end member 34 of the core and coil subassembly 46. Terminal strips 50 may be electrically connected, as desired, to a capacitor and resister combination 84 via a terminal pin 86 at the rearward end of core coil subassembly 46.

Figure 4:
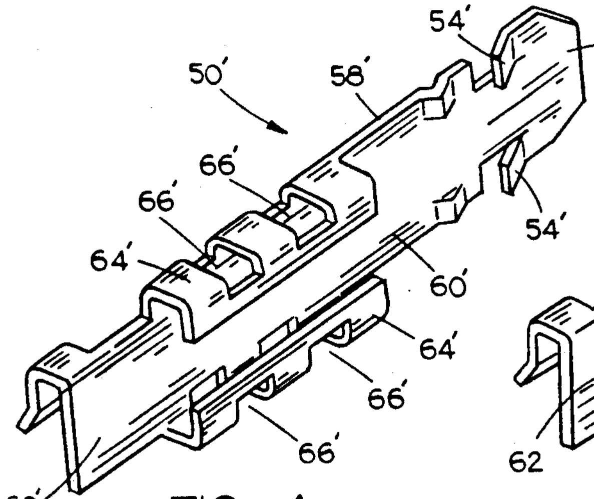
FIG. 4 is a second embodiment of a terminal strip used in the end connector of the present invention.

Referring now to FIG. 4, a second embodiment of a terminal strip is designated generally at 50', and is designed to receive and electrically connect a pair of terminal pins to an appropriate conductor extending from the core and coil of the ballast. In FIG. 4, the designation "'" will be employed to indicate identical structure to that previously described. As can be seen in the drawings, terminal strips 50' have a pair of teeth 54' punched in the rearward end 52' thereof, which are received in pockets on foot portions of a ballast bobbin in a fashion similar to that of the first embodiment of the invention, to lock the terminal strips in position. The rearward end 52' of terminal strips 50' will have a conductor electrically connected thereto in a conventional fashion, which extends from one of the coils of the core and coil subassembly of the ballast. As with terminal strip 50, terminal strip 50' of the second embodiment includes an upper edge 58', lower edge 60' and forward end 62'. The major difference between terminal 50' and terminal 50 is in the use of augmented pin-receiving tabs 64' which have a pair of spaced apart pin-receiving openings 66' so as to allow attachment of two terminal pins therethrough.

In a second embodiment of the ballast, designated generally at 10' in FIG. 6, the core and coil subassembly 46' includes foot portions 36' and 38'—foot portion 36' having terminal strips 50 projecting therefrom and foot portion 38' having terminal strips 50' extending therefrom. The forward end of the ballast is identical to that of FIG. 5, and includes a series of terminal pins 68 connected to terminal members 50 and extended into end connector bar 76. A second end connector bar 76' is mounted in the rearward end 18' of ballast cover 12', as shown in FIG. 6, and will receive an elongated terminal pin 88 extending from terminal strip 50'. Use of a dual pin-receiving terminal strip 50' allows connection of terminal pins 88, in addition to terminal pin 86', utilized in connection with resistor and capacitor combination 84'. Thus, ballast 10' provides end connectors 76 and 76' at both ends of the ballast.

Figure 7:
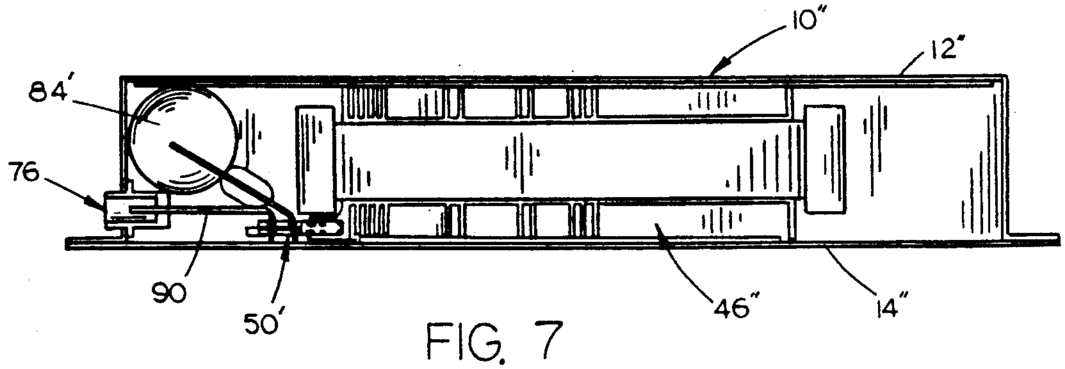
FIG. 7 is a longitudinal sectional view of a third embodiment of the ballast of the present invention.

Referring now to FIG. 7, a third embodiment of the ballast is identified generally at 10'' and includes a ballast cover 12'' covering a core and coil subassembly 46'' and affixed to base portion 14''. In this embodiment, the resistor and capacitor combination 84'' is located at the forward end of the ballast and is connected to terminal strip 50' in the same fashion as the previous embodiments. An elongated terminal pin 90 extends from terminal strip 50' to the forward connector bar 76 in a similar fashion as the previous embodiments.

Although the means by which the various leads from the core and coil subassembly 46 and terminal pins 68 are secured to terminal strips 50 are shown in the preferred embodiment, other types of electrical connection means may also be employed without departing from the spirit of the invention. Furthermore, whereas the invention has been shown and described in connection with the preferred embodiment thereof, it will be understood that many modifications, substitutions and other additions may be made which are within the intended broad scope of the appended claims.

Thus, there has been shown and described an improved leadless ballast having end connectors, which accomplishes at least all of the above stated objects.

We claim:

1. A ballast for a fluorescent lamp, comprising:

a base;

a cord means mounted on said base;

a plurality of coils operatively electrically associated with said core means, each of said coils having at least one conductor extending therefrom;

a cover means positioned over said core means and said coils, and secured to said base to form a totally enclosed housing;

an electrical connector means mounted in a front wall of said cover means with a forward end projecting therefrom and having a plurality of socket means in said forward end for removably receiving and electrically connecting a wiring harness to conductors from said coils;

said connector means having forward and rearward ends and left and right sides, the sockets of said connector means being formed generally horizontally from left to right at the lower end of the front wall of said cover means, for easy connection to a fixture-mounted wiring harness;

a plurality of terminal pins having a forward end extending within said sockets in said electrical connector means for electrical connection to a wiring harness, and a rearward end projecting rearwardly from said connector means into said ballast housing, the rearward end of said terminal pins being electrically connected to predetermined conductors extending from said coils.

2. A ballast for a fluorescent lamp, comprising:

a base;

a cord means mounted on said base;

a plurality of coils operatively electrically associated with said core means, each of said coils having at least one conductor extending therefrom;

a cover means positioned over said core means and said coils, and secured to said base to form a totally enclosed housing;

an electrical connector means mounted in a front wall of said cover means with a forward end projecting therefrom and having a plurality of socket means in said forward end for removably receiving and electrically connecting a wiring harness to conductors from said coils;

a plurality of terminal pins having a forward end extending within said sockets in said electrical connector means for electrical connection to a wiring harness, and a rearward end projecting rearwardly from said connector means into said ballast housing, the rearward end of said terminal pins being electrically connected to predetermined conductors extending from said coils.

the rearward end of said terminal pins each being electrically connected to a terminal strip attached to said core means, said terminal strips being electrically connected to a predetermined conductor extending from said coils.

3. The ballast of claim 2, wherein each said terminal strip includes means for slidably receiving a terminal pin, such that the entire connector means and associated terminal pins is selectively removable from said plurality of terminal strips as a single, integral unit.

4. In combination with a fluorescent light fixture having a wiring harness, a ballast, comprising:

a base;

a core means mounted on said base;

a plurality of coils operatively electrically associated with said core means, each of said coils having at least one conductor extending therefrom;

an electrical connector means mounted in a front wall of said cover means, a plurality of electrical terminal pins mounted in said connector means for electrical connection to the wiring harness;

said terminal pins having a forward end electrically connected to a wiring harness and a rearward end projecting rearwardly from said connector means into said housing, the rearward end of predetermined terminal pins being electrically connected to predetermined conductors extending from said coils;

an elongated rectangular bobbin for supporting said coils in operative association with said core, said bobbin having opposite forward and rearward ends;

foot members extending from the forward and rearward ends of said bobbin for supporting terminal strips projecting therefrom; and a plurality of terminal strips mounted on said foot portions and electrically connecting said terminal pins to predetermined conductors from said coils.

5. In combination with a fluorescent light fixture having a wiring harness, a ballast, comprising:

a base;

a core means mounted on said base;

a plurality of coils operatively electrically associated with said core means, each of said coils having at least one conductor extending therefrom;

an electrical connector means mounted in a front wall of said cover means, a plurality of electrical terminal pins mounted in said connector means for electrical connection to the wiring harness;

said terminal pins having a forward end electrically connected to a wiring harness and a rearward end projecting rearwardly from said connector means into said housing, the rearward end of predetermined terminal pins being electrically connected to predetermined conductors extending from said coils; and a second electrical connector means mounted in a rearward wall of said cover means for electrically connecting a second wiring harness to predetermined conductors extending from said coils.

6. In combination with a fluorescent light fixture having a wiring harness, a ballast, comprising:

a base;

a core means mounted on said base;

a plurality of coils operatively electrically associated with said core means, each of said coils having at least one conductor extending therefrom;

an electrical connector means mounted in a front wall of said cover means, a plurality of electrical terminal pins mounted in said connector means for electrical connection to the wiring harness;

said terminal pins having a forward end electrically connected to a wiring harness and a rearward end projecting rearwardly from said connector means into said housing, the rearward end of predetermined terminal pins being electrically connected to predetermined conductors extending from said coils; and a second electrical connector means mounted in a rearward wall of said cover means for electrically connecting a second wiring harness to predetermined conductors extending from said first electrical connector means.

7. The combination of claim 6, wherein the rearward end of predetermined terminal pins are electrically connected to predetermined conductors in said second electrical connector means.

* * * * *